United States Patent
Ahn et al.

(10) Patent No.: US 9,997,211 B2
(45) Date of Patent: Jun. 12, 2018

(54) SEMICONDUCTOR MEMORY APPARATUS AND OPERATING METHOD

(71) Applicant: SK hynix Inc., Gyeonggi-do (KR)

(72) Inventors: Chang Yong Ahn, Gyeonggi-do (KR); Jun Ho Cheon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/378,308

(22) Filed: Dec. 14, 2016

(65) Prior Publication Data

US 2017/0337950 A1 Nov. 23, 2017

(30) Foreign Application Priority Data

May 18, 2016 (KR) ........................ 10-2016-0061018

(51) Int. Cl.
*G11C 7/06* (2006.01)
*G11C 8/10* (2006.01)
*G11C 7/12* (2006.01)

(52) U.S. Cl.
CPC .............. *G11C 7/062* (2013.01); *G11C 7/067* (2013.01); *G11C 8/10* (2013.01); *G11C 7/12* (2013.01)

(58) Field of Classification Search
CPC ..................................................... G11C 11/16
USPC ......................................................... 365/158
See application file for complete search history.

(56) References Cited

U.S. PATENT DOCUMENTS

| 9,601,176 B2* | 3/2017 | Takaya | G11C 11/1675 |
| 2007/0091707 A1* | 4/2007 | Hidaka | G11C 11/005 365/230.03 |
| 2008/0304354 A1* | 12/2008 | Do | G11C 7/1078 365/233.19 |
| 2014/0293685 A1* | 10/2014 | Noguchi | G11C 11/1675 365/158 |
| 2016/0196873 A1* | 7/2016 | Noguchi | G11C 7/18 365/148 |

FOREIGN PATENT DOCUMENTS

KR    1020120098023    9/2012

* cited by examiner

*Primary Examiner* — Hoai V Ho
*Assistant Examiner* — Minh Dinh
(74) *Attorney, Agent, or Firm* — IP & T Group LLP

(57) ABSTRACT

A semiconductor memory apparatus, including a first mat which includes a first bit line and a first word line and a second mat which includes a second bit line and a second word line, includes a first bit line driving circuit configured to enable the first bit line in response to a first bit line select signal and a first machine bit line select signal; a second bit line driving circuit configured to enable the second bit line in response to a second bit line select signal and a second machine bit line select signal; a column-related decoding circuit configured to selectively enable the first and second bit line select signals in response to a column address; and a state machine configured to selectively enable the first and second machine bit line select signals in response to the column address.

10 Claims, 3 Drawing Sheets

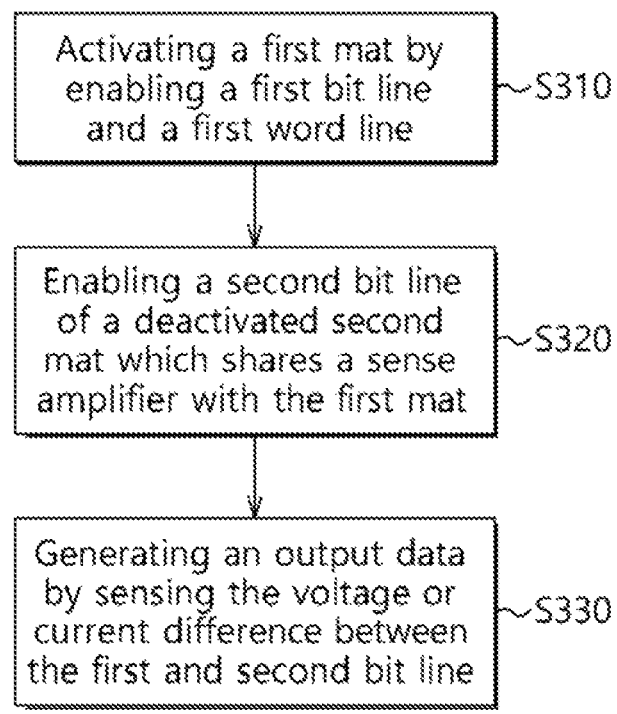

SEMICONDUCTOR MEMORY APPARATUS AND OPERATING METHOD

CROSS-REFERENCES TO RELATED APPLICATION

The present application claims priority under 35 U.S.C. § 119(a) to Korean application number 10-2016-0061018, filed on May 18, 2016, in the Korean Intellectual Property Office, which is incorporated herein by reference in its entirety.

BACKGROUND

1. Technical Field

Various embodiments of the present invention relate to a semiconductor memory apparatus and an operating method thereof.

2. Related Art

Semiconductor memory apparatuses are configured to store data and output stored data.

As semiconductor memory apparatuses trend toward smaller size, higher capacity and lower power consumption, processing of semiconductor memory apparatuses has gradually become more challenging.

As the size of memory cells, the current to be sensed and the distances between the memory cells and associated lines decrease the frequency of data errors due to a leakage current may also increase. Therefore, improvements are desirable.

SUMMARY

The present invention provides an improved semiconductor memory apparatus and a method of operating thereof which capable for measuring a data value of a target memory cell without error due to a leakage current. The semiconductor memory apparatus may substantially cancel a leakage current when sensing the data value of the target memory cell.

In an embodiment, a semiconductor memory apparatus including a first mat which includes a first bit line and a first word line and a second mat which includes a second bit line and a second word line may include: a first bit line driving circuit configured to enable the first bit line in response to a first bit line select signal and a first machine bit line select signal; second bit line driving circuit configured to enable the second bit line in response to a second bit line select signal and second machine bit line select signal; column-related decoding circuit configured to selectively enable the first and second bit line select signals in response to a column address; and a state machine configured to selectively enable the first and second machine bit line select signals in response to the column address.

In an embodiment, a method for operating a semiconductor memory apparatus may include: activating a first mat by enabling both a first bit line and a first word line included in the first mat; enabling only a second bit line of the second bit line and a second word line included in a second mat which is most adjacent to the first mat; and generating output data by sensing a voltage or current difference between the first bit line and the second bit line.

BRIEF DESCRIPTION OF THE DRAWINGS

The above and other features and advantages of the present invention will become more apparent to those skilled in the art to which the present invention pertains by the following detailed description with reference to the attached drawings in which:

FIG. 3 is a flowchart of a method of operation of the semiconductor memory apparatus, in accordance with an embodiment of the present invention.

DETAILED DESCRIPTION

Figure 1:
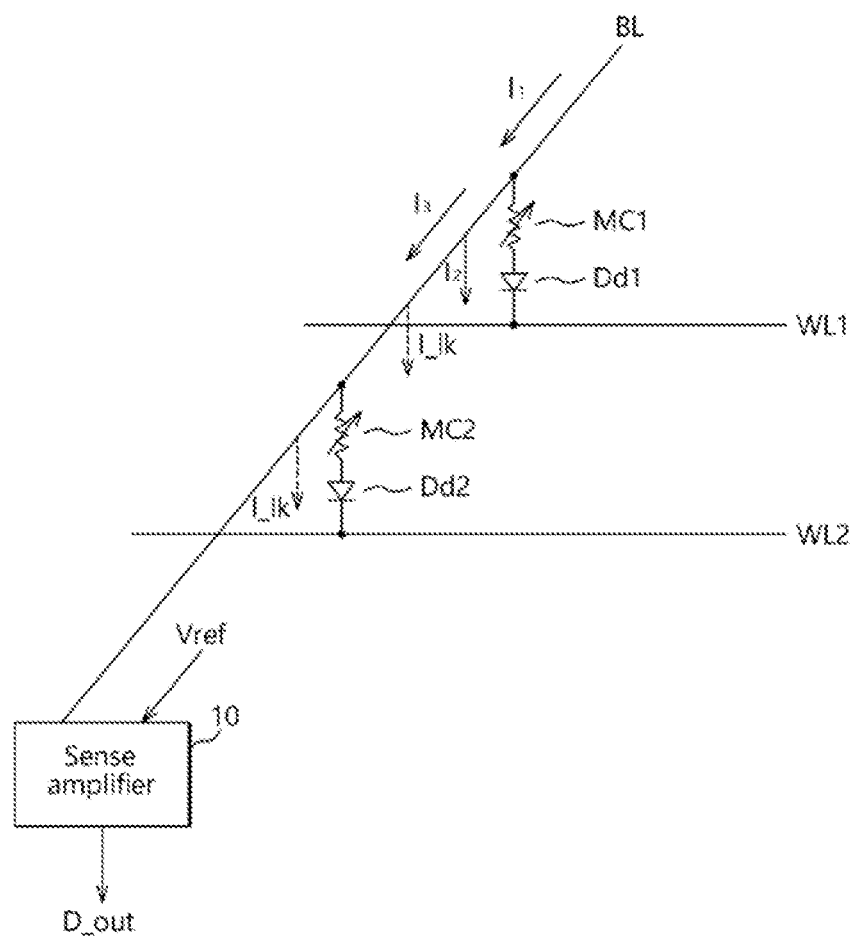
FIG. 1 is a diagram illustrating a conventional semiconductor memory apparatus as a comparative example.

Hereinafter a semiconductor memory apparatus and an operating method will be described below with reference to the accompanying drawings through various examples of embodiments.

The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

FIG. 1 illustrates a conventional semiconductor memory apparatus as a comparative example.

As shown in FIG. 1, the semiconductor memory apparatus may include a bit line BL, first and second word lines WL1 and WL2, a sense amplifier 10, first and second memory cells MC1 and MC2, and first and second diodes Dd1 and Dd2.

The first memory cell MC1 and the first diode Dd1 are coupled in series between the bit line BL and the first word line WL1.

The second memory cell MC2 and the second diode Dd2 are coupled in series between the bit line BL and the second word line WL2.

The sense amplifier 10 is coupled with the bit line BL.

The semiconductor memory apparatus may typically operate is as follows.

In a normal case the bit line BL and the first word line WL1 are selected and activated. When the bit line BL and the first word line WL1 are activated, the first memory cell MC1 is selected.

Then, a first current I1 is provided from the, bit line BL to the first memory cell MC1. A second current I2 flows from the bit line BL to the first word line WL1 through the first memory cell MC1 and the first diode Dd1. The current amount of the second current I2 is determined depending on the resistance value of the first memory cell MC1.

A third current I3 is provided to the sense amplifier 10. The third current I3 may be calculated by subtracting the second current I2 from the first current I1.

The sense amplifier 10 generates an output data D_out by comparing a reference voltage Vref and a voltage corresponding to the current amount of the third current I3.

As described above, a portion of the first current I1 which is flowing into the first memory cell MC1 becomes the second current I2, and the remaining current becomes the third current I3. Since the second current I2 varies depending on the resistance value of the first memory cell MC1, if the current amount of the first current I1 supplied to the bit line BL is known, the resistance value of the first memory cell MC1 which represents a data stored in the first memory cell MC1 may be figured out by sensing the current amount of the third current I3.

In the semiconductor memory apparatus configured as mentioned above, a leakage current I_lk may occur in the bit line BL, making it difficult to precisely figure out the data stored in the first memory cell MC1. The leakage current I_lk may also occur through the second memory cell MC2 and the second diode Dd2 between the bit line BL and the second word line WL2, and may occur as well in the bit line BL itself.

In order to sense the resistance value of the first memory cell MC1, the current amount of the third current I3 corresponding to the resistance value of the first memory cell MC1 should be sensed. However, the leakage current I_lk cannot be measured from the semiconductor memory apparatus of FIG. 1, it is difficult to precisely measure the resistance value and thus the data of the first memory cell MC1.

Figure 2:
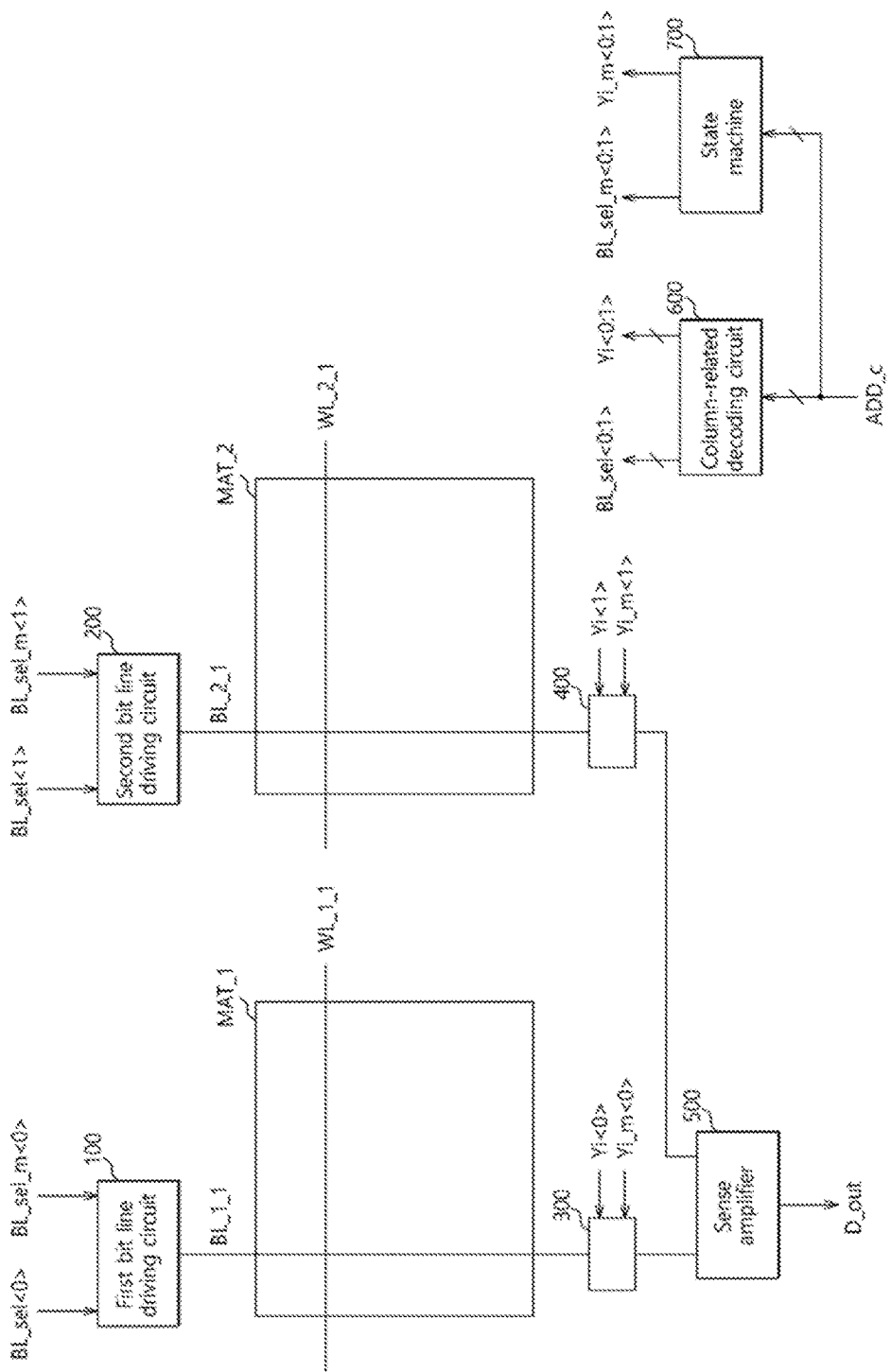
FIG. 2 is simplified diagram illustrating a semiconductor memory apparatus, in accordance with an embodiment of the present invention.

FIG. 2 is a simplified diagram illustrating a semiconductor memory apparatus, in accordance with an embodiment of the present invention.

As shown in FIG. 2, the semiconductor memory apparatus may include first and second mats MAT_1 and MAT_2, first and second bit line driving circuits 100 and 200, first and second switches 300 and 400, a sense amplifier 500, a column-related decoding circuit 600, and a state machine 700. The first and second mats MAT_1 and MAT_2 may share the sense amplifier 500. In an embodiment, the first and second mats may be adjacent to each other.

While each of the first and second mats MAT_1 and MAT_2 includes a plurality of bit lines, a plurality of word lines and a plurality of memory cells single bit lines, BL_1_1 and BL_2_1 and single word lines WL_1_1 and WL2_1 are respectively illustrated in FIG. 2 for the sake, of simplification. Also, since a memory cell may be coupled between a bit line and a word line as shown in FIG. 1, illustration of memory cells in each of the first and second mats MAT_1 MAT_2 are omitted in FIG. 2.

The first bit line driving circuit 100 may provide a current or a voltage to the bit line BL_1_1 of the first mat MAT_1 in response to a first bit line select signal BL_sel<0> and a first machine bit line select signal BL_sel_m<0>. For example, the first bit line driving circuit 100 may provide a current or a voltage to the bit line BL 1_1_1 of the first mat MAT_1 when at least one of the first bit line select signal BL_sel<0> and the first machine bit line select signal BL_sel_m<0> is enabled.

The second bit line driving circuit 200 may provide a current or a voltage to the bit line BL_2_1 of the second mat MAT_2 in response to a second bit line select signal BL_sel<1> and a second machine bit line select signal BL_sel_m<1>. For example, the second bit line driving circuit 200 may provide a current or a voltage to the bit line BL_2_1 of the second mat MAT_2 when at least one of the second bit line select signal BL_sel<1> and the second machine bit line select signal BL_sel_m<1> is enabled.

The first switch 300 may couple or decouple the bit line BL_1_1 of the first mat MAT_1 and the sense amplifier 500 in response to a first column select signal Yi<0> and a first machine column select signal Yi_m<0>. For example, the first switch 300 may couple the bit line BL_1_1 of the first mat MAT_1 and the sense amplifier 500 when at least one of the first column select signal Yi<0> and the first machine column select signal Yi_m<0> is enabled. The first switch 300 may decouple the bit line BL_1_1 of the first mat MAT_1 and the sense amplifier 500 if both the first column select signal Yi<0> and the first machine column select signal Yi_m<0> are disabled.

The second switch 400 may couple or decouple the bit line BL_2_1 of the second mat MAT 2 and the sense amplifier 500 in response to a second column select signal Yi<1> and a second machine column select signal Yi_m<1>. For example, the second switch 400 may couple the bit line BL_2_1 of the second mat MAT_2 and the sense amplifier 500 when at least one of the second column select signal Yi<1> and the second machine column select signal Yi_m<1> is enabled. The second switch 400 may decouple the bit line BL_2_1 of the second mat MAT_2 and the sense amplifier 500 if both the second column select signal Yi<1> and the second machine column select signal Yi_m<1> are disabled.

The sense amplifier 500 may generate an output data D_out by comparing the currents or voltages provided from the bit lines BL_1_1 and BL_2_1 of the first and second mats MAT_1 and MAT_2 through the first and second switches 300 and 400.

The column-related decoding, circuit 600 may decode a column address ADD_c, and generate the first and second bit line select signals BL_sel<0:1> and the first and second column select signals Yi<0:1>. The column-related decoding circuit 600 may include circuits which decode the column address ADD_c and generate the bit line select signals and the column select signals for performing column-related control for the semiconductor memory apparatus. For example, the column-related decoding circuit 600 may include a bit line selection decoder which may decode the column address ADD_c and generate the first and second bit line select signals BL_sel<0:1>, and a column selection decoder which may decode the column address ADD_c and generate the first and second column select signals Yi<0:1>.

The state machine 700 may generate the first and second machine bit line select signals BL_sel_m<0:1> and the first and second machine column select signals Yi_m<0:1> in response to the column address ADD_c. The state machine 700 may receive the column address ADD_c and may enable machine bit line select signals BL_sel_m<0:1> and machine column select signals Yi_m<0:1> corresponding to the bit line select signals BL_sel<0:1> and column select signals Yi<0:1> enabled by the column-related decoding circuit 600. For example, if the column-related decoding circuit 600 enables the first bit line select signal BL_sel<0> and the first column select signal Yi<0> to activate the bit line BL1_1_1 included in the first mat MAT_1, the state machine 700 may enable the second machine bit line select signal BL_sel_m<1> and the second machine column select signal Yi_m<1> to activate the bit line BL_2_1 included in the second mat MAT_2.

The operation of the semiconductor memory apparatus in accordance with the embodiment will be described below.

Descriptions will be made for an operation of sensing the resistance value, that is, data, of a memory cell (not shown) coupled between the bit line BL_1_1 and the word line WL_hd 1_1 included in the first mat MAT_1.

In operation, the bit line BL_1_1 and the, word, line WL_1_1 included in the first mat MAT_1 are enabled or activated.

Then, the bit line BL_2_1 of the second mat MAT_2 is also enabled while the word line WL_2_1 stays disabled since the second mat MAT_2 is currently in a disabled state.

The enablement of the bit line BL_2_1 of the second mat MAT_2 when the bit line BL_1_1 of the first mat MAT_1 is enabled will be described in more detail below.

The column address ADD_c is inputted to the column-related decoding circuit 600 and the state machine 700.

When the column address ADD_c indicates the bit line BL_1_1 of the first mat MAT_1, the column-related decoding circuit 600 enables the first bit line select signal BL_sel<0> and the first column select signal Yi<0>.

Since the state machine 700 receives the column address ADD_c indicating the bit line BL_1_1 of the first mat MAT_1, the state machine 700 enables the second machine bit line select signal BL_sel_m<1> and the second machine column select signal Yi_m<1> in order to activate the bit line BL_2_1 of the second mat MAT_2. At this time, both the bit line BL_1_1 and the word line WL_1_1 are enabled in the first mat MAT_1, whereas only the bit line BL_2_1 is enabled in the second mat MAT_2.

The first bit line driving circuit 100 receives the enabled first bit line select signal BL_sel<0> and activates the bit line BL_1_1 of the first mat MAT_1. Namely, the first bit line driving circuit 100 applies a preset current having a predetermined current amount or a preset voltage having a predetermined voltage level to the bit line BL_1_1 of the first mat MAT_1 in response to the enabled first bit line select signal BL_sel<0>.

The second bit line driving circuit 200 receives the enabled second machine bit line select signal BL_sel_m<1>, and activates the bit line BL_2_1 of the second mat MAT_2. Namely, the second bit line driving circuit 200 applies a preset current of a predetermined current amount or a preset voltage of a predetermined voltage level to the bit line BL_2_1 of the second mat MAT_2 in response to the enabled second machine bit line select signal BL_sel_m<1>.

The first switch 300 couples the bit line BL_1_1 of the first mat MAT_1 to the sense amplifier 500 in response to the enabled first column select signal Yi<0>.

The second switch 400 couples the bit line BL_2_1 of the second mat MAT_2 to the sense amplifier 500 in response to the enabled second machine column select signal Yi_m<1>.

At this time, the first mat MAT_1 is in a state in which both the bit line BL_1_1 and the word line are enabled, whereas the second mat MAT_2 is in the state in which only the bit line BL_2_1 is enabled.

The sense amplifier 500 generates the output data D_out by sensing the current amount difference or the voltage difference between the bit lines BL_1_1 and BL_2_1 of the first and second mats MAT_1 and MAT_2. For example, the sense amplifier 500 may sense the resistance value representing data stored in a memory cell between the enabled bit line BL_1_1 and word line WL_1_1 of the first mat MAT_1, by sensing the voltage or current of the bit line BL_1_1 of the first mat MAT_1 and the voltage or current of the bit line BL_2_1 of the second mat MAT_2.

According to the comparative example of FIG. 1, the voltage or current amount of the bit line BL is determined based on the reference voltage Vref. Therefore, in the case where leakage current I_lk occurs in the bit line BL of the semiconductor memory apparatus of FIG. 1, it is difficult to precisely determine the current or current amount of the bit line BL since the determination is made with reference to the reference voltage Vref having a constant voltage level.

However, in accordance with an embodiment of the present disclosure, the resistance or data value of a target memory cell in an activated mat (e.g., the first mat MAT_1) may be measured without error caused by the leakage current by taking as a reference value the amount of current or voltage of the bit line in a deactivated mat (e.g., the second mat MAT_2) sharing sense amplifier 500 with the activated mat and by comparing or sensing the voltages or current amounts of the bit lines between the deactivated mat and the activated mat. Since both of the activated and deactivated mats (i.e., the first and second mats MAT_1 and MAT_2) sharing the sense amplifier 500 may have similar amount of the leakage current if any, the difference in the voltages or current amounts of the bit lines between the deactivated and activated mats will cancel out the leakage current. Therefore, the sense amplifier 500 may sense or determine the resistance value of the target memory cell without the risk of error caused by the leakage current of the bit lines. As a consequence, it is possible to sense and determine the resistance value representing data stored in a memory cell of the activated mat without the risk of error caused by the leakage current of the bit lines.

A method for operating the semiconductor memory apparatus of FIG. 2 may be as follows.

Referring to FIG. 3, after a step S310 of activating the first mat MAT_1 by enabling both the first bit line BL_1_1 and the first word line WL_1_, a step S320 of enabling only the second bit line BL_2_1 of the deactivated second mat MAT_2 sharing the sense amplifier 500 with the first mat is performed. Then a step S330 of generating output data D_out by sensing the voltage or current difference between the first bit line BL_1_1 and the second bit line BL_2_1 is performed.

The step S320 of enabling only the second bit line BL_2_1 may include a step of enabling the second bit line BL_2_1 in response to a column address indicating the first bit line BL_1_1, and employs a state machine which operates in response to the column address.

The step of generating the output data out may employ the sense amplifier 500 to which the first and second bit lines BL_1_1 and BL_2_1 are coupled.

While the present invention has been described in reference to a specific embodiment, it will be understood to those skilled in the art that the described embodiment is described as an example of the invention only. Accordingly, the semiconductor memory apparatus and the operating method described herein should not be limited based on the described embodiment. It will be apparent to those skilled in the art that various other embodiments and modifications may be made without departing from the spirit and scope of the invention as defined in the following claims.

What is claimed is:

1. A semiconductor memory apparatus comprising:
   a first mat including a first bit line and a first word line;
   a second mat including a second bit line and a second word line;
   a first bit line driving circuit configured to enable the first bit line in response to at least one of a first bit line select signal and a first machine bit line select signal;
   a second bit line driving circuit configured to enable the second bit line in response to at least one of a second bit line select signal and a second machine bit line select signal;
   a column-related decoding circuit configured to selectively enable the first and second bit line select signals in response to a column address; and
   a state machine configured to selectively enable the first and second machine bit line select signals in response to the column address.

2. The semiconductor memory apparatus according to claim 1, further comprising:
   a sense amplifier configured to generate output data by sensing a voltage or current difference between the first bit line and the second bit line.

3. The semiconductor memory apparatus according to claim 1, wherein the first bit line driving circuit enables the first bit line if at least one of the first bit line select signal and the first machine bit line select signal is enabled.

4. The semiconductor memory apparatus according to claim 1, wherein the enabling of the first bit line includes the first bit line driving circuit providing a preset current or a voltage to the first bit line if at least one of the first bit line select signal and the first machine bit line select signal is enabled.

5. The semiconductor memory apparatus according to claim 1, wherein the second bit line driving circuit enables the second bit line if at least one of the second bit line select signal and the second machine bit line select signal is enabled.

6. The semiconductor memory apparatus according to claim 1, wherein the enabling of the second bit line includes the second bit line driving circuit providing a preset current or voltage to the second bit line if at least one of the second bit line select signal and the second machine bit line select signal is enabled.

7. The semiconductor memory apparatus according to claim 1, wherein the state machine enables the second machine bit line select signal if the column-related decoding circuit enables the first bit line select signal in response to the column address.

8. The semiconductor memory apparatus according to claim 2, wherein the column-related decoding circuit additionally generates a first column select signal and a second column select signal in response to the column address.

9. The semiconductor memory apparatus according to claim 8, wherein the state machine additionally generates a first machine column select signal and a second machine column select signal in response to the column address.

10. The semiconductor memory apparatus according to claim 9, further comprising:
   a first switch configured to couple and decouple the first bit line and the sense amplifier in response to at least one of the first column select signal and the first machine column select signal; and
   a second switch configured to couple and decouple the second bit line and the sense amplifier in response to at least one of the second column select signal and the second machine column select signal.

* * * * *